United States Patent [19]

Gallios

[11] Patent Number: 4,594,648
[45] Date of Patent: Jun. 10, 1986

[54] WIDE FREQUENCY BAND COUPLING NETWORK FOR AN ACTIVE RIPPLE AND NOISE FILTER

[75] Inventor: George C. Gallios, Setauket, N.Y.

[73] Assignee: Venus Scientific Inc., Farmingdale, N.Y.

[21] Appl. No.: 675,342

[22] Filed: Nov. 28, 1984

[51] Int. Cl.⁴ ............................................. H02M 1/12
[52] U.S. Cl. ........................................ 363/46; 328/167
[58] Field of Search ....................... 363/39, 44, 45, 46, 363/47, 48; 333/181; 328/167, 263

[56] References Cited

U.S. PATENT DOCUMENTS 3,628,057 12/1971 Mueller .............................. 328/167
3,670,230 6/1972 Rooney et al. ....................... 363/46

FOREIGN PATENT DOCUMENTS 623243 9/1978 U.S.S.R. ............................... 363/46
750671 7/1980 U.S.S.R. ............................... 363/46
1012404 4/1983 U.S.S.R. ............................... 363/46

Primary Examiner—Peter S. Wong
Assistant Examiner—Judson H. Jones
Attorney, Agent, or Firm—Ostrolenk, Faber, Gerb & Soffen

[57] ABSTRACT

A ripple and noise filter for high voltage DC converters or power supplies. The filter includes a common terminal, an input terminal and an output terminal. A voltage sensing circuit is connected between the output and common terminals of the filter and is adapted to produce a sense signal which is proportional to the output voltage at the output terminal. An active filtering circuit, preferably an amplifier having a frequency operating range which covers the frequency spectrum of the ripple and noise voltages, includes an input for receiving the sense signal and an output at which a correction signal is generated. The correction signal has a magnitude and waveform such that coupling the correction signal onto the output terminal of the filter eliminates or reduces the ripple and noise. A passive coupling element, preferably a capacitor, isolates the amplifier from the output terminal and couples the correction signal thereto. A passive filter, also a capacitor, is connected across the output and common terminals of the filter. The coupling capacitor and the passive filter capacitor have nearly identical electrical characteristics so that the correction signal is coupled onto the output terminal without distortion over the full frequency operating range of the amplifier.

14 Claims, 6 Drawing Figures

WIDE FREQUENCY BAND COUPLING NETWORK FOR AN ACTIVE RIPPLE AND NOISE FILTER

BACKGROUND OF THE INVENTION

The present invention relates to a ripple and noise filter circuit, and more particularly to a ripple and noise filter circuit with a wide frequency operating range for use with very high voltage DC power supplies.

The type of filter circuit (or simply filter) to which the present invention relates is commonly used for filtering unwanted ripple and noise voltages from the DC output of a DC power supply incorporating an AC to DC converter circuit. A description of a switching mode converter circuit of the type with which the filter circuit of the present invention may be used is disclosed in U.S. Pat. No. 4,475,149.

Ripple voltages are periodic small voltage modulations of the DC output voltage of the converter or DC power supply. A ripple voltage appears, on an oscilloscope, as a small wave-shaped voltage which "rides" on top of the output DC voltage. The source and cause of ripple is most often the AC power input which includes AC voltage components which unavoidably are coupled onto the DC output terminals of the converter. Ripple voltages are, therefore, primarily low frequency waveforms, in the range of from 60 cycles to several hundred cycles per second.

Voltage or noise spikes, on the other hand, are voltage bursts which momentarily shoot above or below the steady state DC voltage level of the converter. The voltage bursts are very narrow and last for a very short time, usually in the order of nanoseconds or, at most, several microseconds. The spikes tend to appear periodically or spuriously on the DC output line at intervals which are determined by, among other factors, the converter's chopping frequency and/or the load's characteristics. Voltage spikes are characterized in that they possess very sharply rising and falling edges. Consequently, the frequency spectrum of the noise spikes extends well into the megahertz frequency range and may include voltage noise components with a frequency of up to 20 to 50 megahertz.

To remove, or more correctly to reduce, the ripple and noise from the DC output, a filter circuit is interposed between the DC output terminals of the converter and the load. A load refers generally to an electrical device or component which is powered by, uses, or operates off the DC voltage. The load may be resistive or reactive. It may be a device such as a simple DC light bulb or a complex electronic circuit or motor in which current requirements fluctuate wildly according to a complex set of criteria.

In any event, the filter's function is to monitor the output voltage, detect unwanted voltage variations due to ripple or spikes and compensate for the ripple and spikes by "modifying" the output voltage in a manner which negates the effect of ripple/noise to produce a "clean" DC output.

To do so, the filter must have an operating range over a wide frequency band which is as wide as the bandwidth of the ripple or noise voltages. In the applications to which the present invention is particularly relevant, the frequency range or bandwidth is from 50 hertz to several megahertz. The filter must also be capable of operating in the environment of the high voltage converter in which voltage levels of hundreds, and perhaps several thousand volts, are present. Additionally, the filter circuit must not add significant weight, space or costs to the overall converter or DC supply.

The prior art teaches two general types of filter circuits for filtering ripple and noise voltages from power supplies. The structure, operation and limitations of these filters, particularly in relation to their use with a high voltage converter, will be discussed below. The two filter types are known as the passive filter and the active filter designs.

In a passive filter, passive components (resistors, capacitors, and inductors) are used exclusively. The filter design offers the advantage of relatively inexpensive discreet components which can be readily selected and specified to withstand high voltages.

Nevertheless, the use of a passive filter in conjunction with high voltage DC voltages is impractical for the following reasons. A passive filter usually includes a filtering inductor and a filtering capacitor. The inductor and the capacitor must be selected to have a resonating frequency which is significantly below the frequency range of operation of the filter. This is important because if ripple and noise voltages include frequency components that fall in the range of resonance of the filter, these noise and ripple voltages will be accentuated instead of being eliminated. To ensure that the filter resonates at very low frequencies, the filters characteristic impedance, which is related to the ratio of the inductor divided by the capacitor volume, must be kept very low. This is difficult to achieve in high voltage power supplies, particularly if the volume is limited.

Furthermore, the filter must be well damped so that changes in output current or input line voltage at the filter's resonant frequency are not accentuated. Therefore, a damping resistor with a value equal to or less than the low characteristic impedance is included in the filter. To avoid excessive dissipation in the damping resistor, a blocking capacitor must be also added in series with the damping resistor.

The component values which would satisfy both criteria, result in a filter circuit which is usually too large to fit within the volume allocated to high performance power supplies. In addition, it is more difficult to design a filter with a flat frequency response over a wide frequency range by using only passive elements.

Filter designers prefer, therefore, to use active elements, including amplifiers to provide an active ripple and noise filter. With an active filter, the frequency response or the performance of the filter over a desired frequency range can be more accurately controlled. However, active filters include delicate electronic components which cannot withstand high voltages. In this connection, it should be made clear that certain active elements are capable of operation with voltages of perhaps up to 20 or 30 volts and their use even in lower voltage supplies involves design compromises.

In one active filter prior art embodiment, the filter includes a sensing circuit for generating the sense signal for an amplifier. The amplifer produces an output signal which is coupled back onto the DC output by means of an isolation transformer.

The isolation transformer which receives the output from the amplifier at its primary winding must be able to reproduce the signal on its secondary winding without distortion. This is achievable only with a transformer which has a frequency operating range as wide as the bandwidth of the amplifier itself. A transformer with a frequency range of from 100 hertz to over 1 megahertz must meet the following requirements:

(1) it must sustain relatively high DC current in its secondary;
(2) it must have a relatively large primary inductance to provide low frequency response without overloading the active filter's amplifier output;
(3) it must include sufficient insulation to permit it to reliably withstand high secondary DC voltages; and
(4) it must exhibit very low primary to secondary leakage inductance, particulary since the secondary winding is "loaded" by the converter's output capacitance.

The above requirements mandate a transformer of a size and cost which makes its use in high voltage power supplies undesirable.

In view of the foregoing discussion, it is seen that the prior art has not been successful in providing a suitable ripple and noise filtering circuit without incurring severe space, weight, and cost penalties.

SUMMARY OF THE INVENTION

It is an object of the present invention to provide a ripple and noise voltage filter for a high voltage power supply.

It is another object of the present invention to provide a reliable, low weight and reduced volume filter for a high voltage power supply.

It is still another object of the present invention to provide a filter which uses passive and active components and which offers a high to low operating frequency ratio of better than 1,000,000:1 and which is usable in both high voltage and low voltage power supplies.

It is still a further object of the present invention to provide an inexpensive and high quality filter for filtering ripple and noise voltages from a DC voltage output.

The foregoing and other objects are achieved with the ripple and noise filter according to the present invention. The filter includes an input terminal and a common terminal which are connected to a converter and an output terminal which can be connected to a load. Voltage sensing means produce a sense signal which is proportional to the output voltage at the output terminal of the filter. An active filtering circuit has an input for receiving the sense signal and an output terminal. The active filtering circuit is adapted to generate at the output terminal of the active filtering circuit a correction signal which has a magnitude and waveform which tends to reduce the ripple and noise voltages at the output terminal of the overall filter when the correction signal is combined or coupled from the output terminal of the filtering circuit onto the output terminal of the filter.

A passive coupling element is used for coupling the correction signal from the filtering circuit to the output terminal of the filter. Also included is a passive filter element which is connected between the output terminal and the common terminal of the filter. Very significantly, the invention provides that the passive coupling element and the passive filter element must have nearly identical electrical characteristics to ensure that the correction signal is coupled onto the output terminal without distortion, i.e. to provide a flat frequency response over the selected bandwidth.

In preferred embodiments, the passive coupling element and the passive filter element are capacitors. By specifying that the capacitors have "electrically identical characteristics", is meant that these capacitors which represent a lumped circuit consisting of an in-series connected capacitor, inductor and resistor and a leakage resistor are matched so that the frequency response of the two capacitors is identical. It is also preferable that the active filtering circuit have a frequency bandwidth which is sufficiently wide to cover the range of frequencies in which ripple and noise voltage components appear.

In a further preferred embodiment, the passive filter capacitor and the coupling capacitors are of identical capacitor values in order to obtain a predictable 0.5 attentuation factor and to ensure that the two capacitors are indeed "matched" to guarantee that the active filter is capable of coupling to the DC output the correction signal without distortion over the desired frequency range.

To further improve the filter's performance at lower frequencies, the invention preferably incoorporates a transformer. The primary of the transformer receives the correction signal from the active filtering circuit and its secondary winding is inserted in series with the input terminal of the filter. The turns ratio of the transformer is selected to produce an attenuation factor which is comparable to the impedance of the passive filter element and the coupling element combination.

In accordance with the present invention, where the passive filter element has a capacitor value of $C_F$ and the coupling element has a capacitor value of $C_D$, the turns ratio N should be selected as $N = C_D \div (C_D + C_F)$. The addition of the transformer to the filter improves the low frequency response of the filter and increases its ability to reject line frequency ripple voltages. Because the transformer is optimized for low frequencies, the size and cost limitations associated with prior art transformers for filters are avoided.

With the addition of the transformer into the filter circuit, a high to low frequency ratio exceeding 1,000,000:1 is obtained. It is also important to note at this point that while the filter in accordance with the present invention is particularly advantageous for use with high voltage converters, its use with lower voltage devices is also contemplated.

Other features and advantages of the invention will become apparent by reference to the drawings and the detailed description.

BRIEF DESCRIPTION OF THE DRAWINGS

This and other objects of the invention will become apparent to those skilled in this art from the following description in which.

DETAILED DESCRIPTION OF THE DRAWINGS

Figure 1:
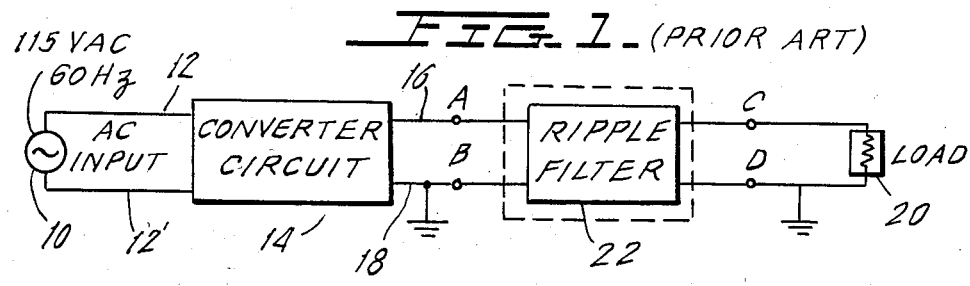
FIG. 1 is a schematic block diagram of a prior art converter circuit including a ripple filter.

A block diagram of a prior art power supply incorporating a ripple filter is illustrated in FIG. 1. The function of the circuits in FIG. 1 is to convert an AC power input voltage, such as is available through general power distribution systems, into a DC voltage which can be applied to a load. Conventionally, therefore, an AC power source 10 is applied to the AC power input lines 12, 12' of a converter circuit 14. The function of the converter circuit 14 is to receive the AC power and to generate therefrom a suitable DC voltage at output lines 16 and 18.

While the AC source 10 is shown to be a 115 VAC, 60 hertz AC power source, converters are equally capable of operation with AC inputs comprising three phase, 400 hertz power or with single phase power lines which can deviate from the 60 hertz standard.

The converter circuit is used for converting an AC voltage waveform to a suitable DC output. The design and construction of the converter circuit 14 is known in the art and will not be described herein. One example of such a circuit is described in U.S. Pat. No. 4,475,149.

The DC voltage from the converter circuit 10 appears at the output terminals 16 and 18. Ideally, the DC output voltage should be a constant voltage free of pertubations or voltage variations. The DC voltage should also be directly connectable to a load 20 and the converter circuit 14 should be able to maintain the DC output voltage at a constant level irrespective of current fluctuations in the load 20.

In fact, a purely noise free and constant DC voltage cannot be generated by a converter circuit. Due to inherent voltage switchings in the converter 14 and to current fluctuations in the load 20, as well as to other factors, the DC output is invariably contaminated by ripple and noise or spike voltages. To reduce the effects of noise and ripple, a ripple filter circuit 22 is interposed between the converter circuit 14 and the load 20. The present invention is related to a particulary advantageous embodiment of a ripple and noise filter.

Figure 2:
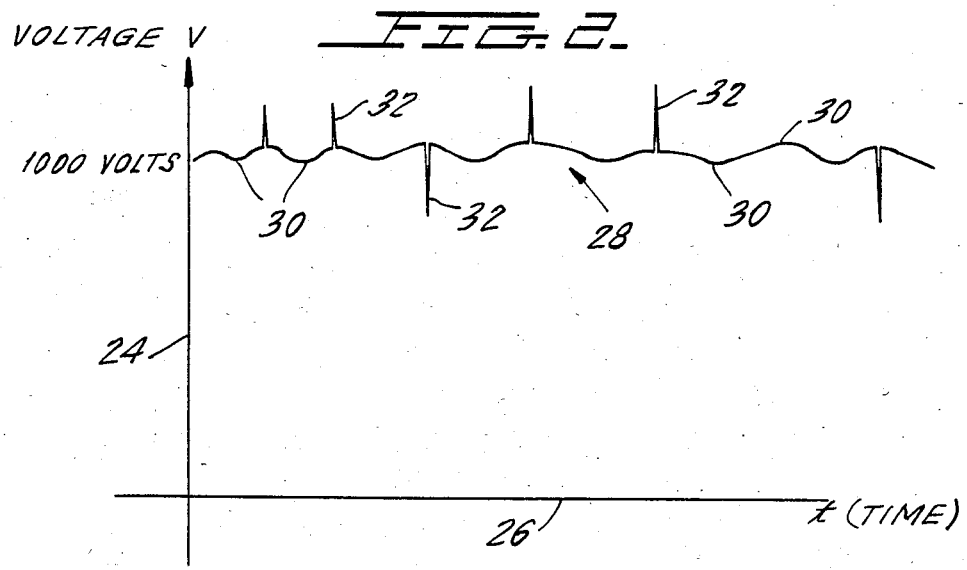
FIG. 2 is a plot of an unfiltered DC voltage which includes ripple and noise voltage components.

An example of a DC voltage which includes ripple and noise is shown in FIG. 2. The ordinate axis 24 is graduated in volts and the abcissa 28 indicates time. A DC voltage 28 which ideally should appear as a straight horizontal line at voltage level 1,000 (1,000 volts is selected because the present invention is particularly useful with high voltage DC supplies). Instead, it can be seen that the DC voltage includes ripple voltage components 30 and noise spike voltage components 32.

As has been previously discussed, the ripple voltage components 30 usually originates from the AC input lines and consequently comprise voltage waveform signals which occupy, in the frequency domain, the lower frequency regions. Usually, this frequency region is lower than 1,000 cycles per second.

The spike voltage components 32, on the other hand, are caused by switching voltages within the converter circuit 14 of FIG. 1, or in the load 20. The spikes are sharp pulses which include high frequency voltage components. The voltage spikes which appear in the DC outputs of all available converter circuits have frequency components which extend into the megahertz range and which often reach as high as 50 megahertz.

To effectively filter unwanted ripple and noise, the filter circuit 22 must be capable of operating over a wide frequency range which has a low frequency cutoff point below the ripple voltage frequency components and high frequency cutoff point which exceeds the highest frequency of the noise or ripple voltage.

Figure 3:
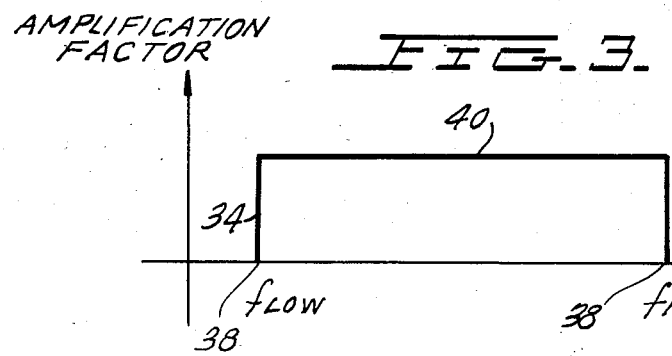
FIG. 3 is a plot of the frequency response of an ideal ripple filter.

An ideal filter should have the filter frequency characteristic shown in FIG. 3. It should have a sharp low frequency rolloff 34 at a frequency $f_{low}$, 36, a high frequency cutoff point 38 at a frequency $f_{high}$ which exceeds the highest noise frequency component and a flat amplification level 40 over its operating frequency range. With such a filter, noise components at different frequency values can be handled with equal effect.

Practically, filters can be designed to only approximate the ideal response and the closer a filter comes to the ideal filter, the more complex is its circuitry with attendant increases in size, weight and cost.

Figure 4:
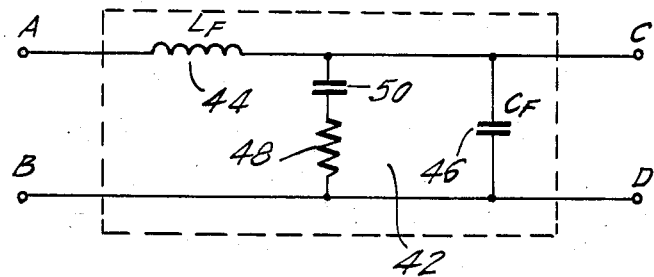
FIG. 4 is a prior art passive filter circuit which can be used as the ripple filter of FIG. 1.
Figure 5:
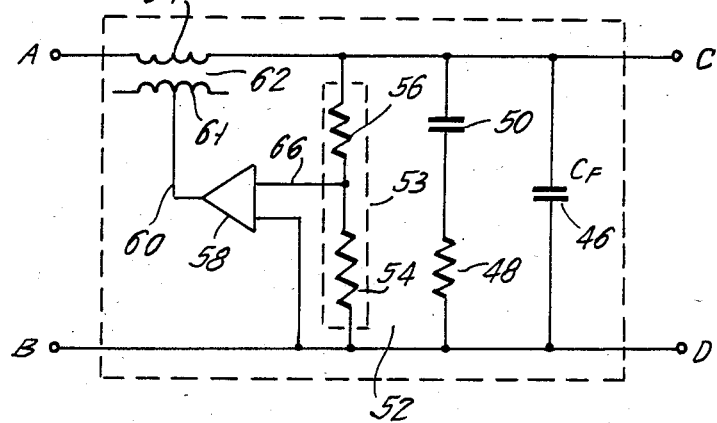
FIG. 5 is a prior art active filter circuit which can be used as the ripple filter of FIG. 1.

FIGS. 4 and 5 show prior art embodiments of ripple filters. FIG. 4 shows a passive filter circuit and FIG. 5 shows an active filter circuit. The limitations of these filters, particulary their inability to operate properly with very high DC voltages in the range of 100 to 1,000 or more volts, will be explained to facilitate understanding of the present invention.

In the damped passive ripple filter 42 of FIG. 4, A is the DC input terminal and B is the common input terminal, i.e. ground. The DC voltage at terminal A is filtered by a filter comprised of a line inductor 44 and an output passive filter element 46. The output filter element 46 is a capacitor. The line filter inductor 44 and the capacitor 46 are designed to resonate significantly below the frequencies which are to be rejected ($<f_{low}$) so that both line frequency related ripple and spikes generated by the converter circuit 14 and by the load 20 are eliminated. The filter defined by the inductor 44 and the capacitor 46 has an impedance characteristic which is related to the ratio of $L_F \div C_F$ (the respective values of these components) which must be kept sufficiently low so that step changes in the ouput current do not introduce excessive output voltage transients, i.e. voltage spikes. This is difficult to achieve in high voltage power supplies, particularly if weight limitations are considered.

The passive filter 42, as described above, must also be sufficiently damped so that changes in output current or input line voltages at the filter's resonant frequency are not accentuated. Therefore, a damping resistor 48 must be included and it must have a resistance value which is equal to or less than the load's characteristic impedance in order to provide proper damping. To avoid excessive dissipation in the damping resistor 48, a blocking capacitor 50 is used to prevent high currents from flowing in the resistor 48. Unfortunately, the value of the blocking capacitor 50 must be made at least an order of magnitude larger than the output capacitor 46 in order to achieve the desired performance. Such a passive filter tends to be too large to fit within the value which is usually allocated to a high performance and a high voltage converter circuit.

An alternative to the passive filter 42 described above, is available in the active filter 52 shown in FIG. 5. The filter 52 includes an output filtering element, or a capacitor 46, positioned across the output terminals D and C of the filter, a damping network comprised of resistor 48 and capacitor 50 in parallel with output capacitor 46, a sensing circuit 53 comprised of voltage dividing resistors 54 and 56 and an active filtering circuit comprised of amplifier 58. The output 60 of the amplifier 58 is coupled to the primary winding 61 of a transformer 62, the secondary windings 64 being connected in series with the input terminal A of the filter 52. The amplifier 58 receives an attenuated signal 66 which is proportional to the output voltage at the output terminal C and generates in response a correction signal at its output terminal 60 which is fed back to the output by means of the transformer 62.

An amplifier circuit 58 in combination with a transformer 62 is preferred because an amplifier circuit is well suited for obtaining a wide frequency response filter. However, the amplifier 58 includes delicate electronic components which must be protected from the high voltages in the DC supply. The transformer 62 is employed to isolate the amplifier 58 from the high voltages which are present at the input or output terminals A or C of the filter 52. Transformers, however, tend to have narrower bandwidths and the transformer 62 consequently operates to distort the signals which it receives from the amplifier 58, particularly at high frequency ranges.

If an effort is made to design the transformer with a higher frequency operating range, size and cost increases makes the use of the transformer in high voltage applications impractical.

Figure 6:
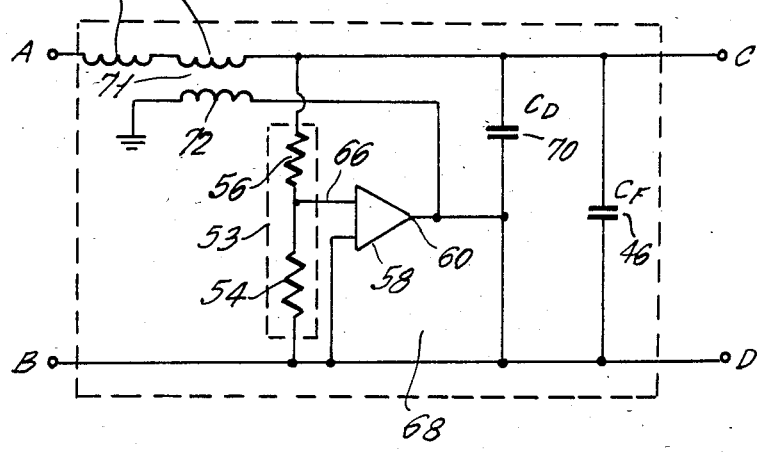
FIG. 6 is a circuit diagram of a ripple and noise filter, in accordance with the present invention, for use as the ripple filter shown in FIG. 1.

The ripple and noise filter shown in FIG. 6 overcomes the limitations of prior art filters and is suitable for operation with high DC voltages. The filter 68 of the present invention includes an output capacitor 46 connected across the output terminals C and D and a sensing circuit 53 comprised of resistors 54 and 56 connected in parallel with the output capacitor 46 and operating to generate a sense signal 66 for an active filtering circuit comprising amplifier 58. The amplifier 58 is a wideband amplifier with a "flat" bandwidth over the frequencies from near DC up to several megahertz. The amplifier 58 produces a correction signal at its output terminal 60 which is coupled back to the output terminal C by means of a coupling capacitor 70.

The circuit of FIG. 6 comprises a "feedback" arrangement in which ripple and spike voltages which appear at the output terminal C are sensed by the sensing circuit 54, 56 and applied to the amplifier 58 which produces a correction signal at its output terminal 60. The correction signal has a waveform which is identical to the waveform of the ripple but which, at the same time, is opposite in polarity in order to "negate" or cancel the ripple and noise voltages. That is, the function of the amplifier is to drive the output voltage to a new voltage which tends to cancel the ripple and spike voltages.

Since ordinarily, the currents associated with the ripple voltage at the output terminal C pass through the output capacitor 46, the amplifier 58 acts to divert that current from the output capacitor 46 by passing the current through the coupling capacitor 70. In this manner, the voltage variation attributable to ripple and voltage spikes are "absorbed" by the active filter amplifier and are eliminated from the output DC voltage at output terminal C.

The correction signal at the output 60 of the amplifer 58 is tailored to directly cancel the ripple and noise currents in the output capacitor 46. The coupling capacitor must transmit the exact waveform (over the full frequency bandwidth) produced by the amplifier 58 to the output C without distortion or alteration. Consequently, the output capacitor 46 and the coupling capacitor 70 must be electrically identical. By "electrically identical", is meant that these capacitors (which invariably comprise a lump circuit comprised of a series capacitor, inductor, resistor, and a leakage resistor) are matched to one another so that their frequency response is identical.

When the coupling capacitor 70 and the output capacitor 46 are matched, the correction signal developed in the active filter is transferred without distortion to the output terminal C. At the same time, the amplifer 58 is "isolated", by the capacitor 70, from the high voltages at the output terminal C. By substituting a coupling capacitor which is electrically identical to the output capacitor 46 for the transformer, this circuit is able to eliminate from the filter a cumbersome, expensive and generally less suitable device, i.e. a transformer.

For practical reasons, it is often advantageous to specify that the coupling capacitor 70 and the output capacitor 46 be chosen from the same manufacturer's lot and that they be specified to have the same capacitor values to insure that they are indeed matched.

With the filter according to the invention, undesirable ripple and spike voltages are sensed by the amplifier 58 and converted to the correction signal which is tailored in magnitude, frequency, and phase to cancel the ripple voltages. The amplifier 58 essentially converts a ripple and noise voltage input into a current at its output, and is, therefore, a transconductance amplifier. Furthermore, the negative feedback through the amplifier 58 acts to minimize change at the output terminal C of the filter 68. Therefore, the filter 68 inherently provides good damping to the output passive filter 46.

From an impedance point of view, the load 20 is driven by a pair or combination of the output capacitor 46 and the coupling capacitor 70. Consequently, the effectiveness of the filter is reduced at lower frequencies where the impedance of the capacitors 46, 70 becomes equal to the impedance of the load 20 itself. To improve the low frequency response of the amplifier, a transformer 71 is added to the previously described filter circuit as follows. The transformer 71 includes a primary winding 72 connected to the output terminal 60 of the amplifier 58. The secondary winding 74 of the transformer 70 is connected in series between a line inductor 44 and the sensing resistors 54, 56.

In this manner, at lower frequencies where the effectiveness of the output capacitor 46 and the coupling capacitor 70 is reduced, the correction signal from the amplifier 58 is applied to the output terminal C through the transformer 71. The transformer 71 is selected to have a particularly effective response at lower frequencies. With the inclusion of the transformer, the full bandwidth of the filter circuit is expanded to improve the filter's low frequency response. Thus, the transformer 70 is predominant at lower frequencies while the coupling capacitor 70 is predominant at higher frequencies.

Since it is important to have a frequency response which is flat over the full ripple and noise frequency range, the transformer 71 can, advantageously, be specified to have a turns ratio which is equal to the ratio of the capacitor values of the coupling capacitor 70 ($C_D$) divided by the sum of the capacitor values $C_F$ and $C_D$. Therefore, N, the turns ratio, is equal to $C_D \div (C_D + C_F)$. The high frequency cutoff of the transformer 71 is selected to be about twice the low frequency cutoff of the circuit consisting of the output capacitor 46 and the coupling capacitor 70. Thereby, a smooth and flat transition is provided at the point at which the transformer 71 or the coupling capacitor- /output capacitor combination 46, 70 begin to dominate their respective frequency ranges.

Although the present invention has been described in connection with preferred embodiments, many variations and modifications will now become apparent to those skilled in the art. It is preferred, therefore, that the present invention be limited not by the specific disclosure herein, but only by the appended claims.

What is claimed is:

1. A filter for filtering ripple and noise voltages from a DC voltage, said filter comprising:
   a common terminal, an input terminal and an output terminal;
   voltage sensing means for producing a sense signal which is proportional to an output voltage at said output terminal;
   an active filtering circuit having an input for receiving said sense signal and an output terminal, said active filtering circuit being adapted to generate at said output terminal of said circuit a correction signal having a magnituide and waveform such that coupling said correction signal onto said output terminal of said filter tends to reduce said ripple and noise voltages;
   a passive coupling element connected between said output terminal of said active filtering circuit and said output terminal of said filter; and
   a passive filter element connected between said output terminal and said common terminal of said filter, said passive coupling element and said passive filter element having nearly identical electrical characteristics.

2. The filter of claim 1, wherein said passive filter element and said coupling element comprise respective capacitors.

3. The filter of claim 2, wherein said active filtering circuit is selected to have a flat and broad frequency response over the frequency range from 30 hertz to 20 megahertz and wherein said passive filter capacitor and said coupling capacitor have equal capacitor values.

4. The filter of claim 3, wherein said active filtering circuit comprises a transconductance amplifier.

5. The filter of claim 4, further comprising a transformer having a primary winding connected to said output terminal of said amplifier and a secondary winding connected between said input terminal and said output terminal of said filter.

6. The filter of claim 5, wherein said transformer is formed to have a turns ratio $N = C_D \div (C_D + C_F)$, wherein $C_D$ and $C_F$ are the capacitor values of said coupling capacitor and said output capacitor, respectively.

7. A ripple and noise filter for filtering a high voltage DC signal, said filter comprising:
   a common terminal, an input terminal and an output terminal;
   an inductor having first and second terminals, said first terminal of said inductor being connected to said input terminal of said filter, said second terminal being coupled to said output terminal of said filter;
   voltage sensing means for producing a sense signal which is proportional to an output voltage at said output terminal, said voltage sensing means being connected between said output terminal and said common terminal of said filter;
   an active filtering circuit having an input for receiving said sense signal and an output terminal, said active filtering circuit being adapted to generate at said output terminal of said active filtering circuit a correction signal having a magnitude and waveform such that coupling said correction signal onto said output terminal of said filter tends to reduce said ripple and noise voltages;
   a passive coupling element connected between said output terminal of said active filtering circuit and said output terminal of said filter; and
   a passive filter element connected between said output terminal and said common terminal of said filter, said passive coupling element and said passive filter element having nearly identical electrical characteristics.

8. The filter of claim 7, further comprising a transformer having a primary and a secondary, said primary of said transformer being coupled to said output terminal of said active filtering circuit, said secondary of said transformer being arranged in series between said second terminal of said inductor and said voltage sensing means.

9. The filter of claim 8, wherein said passive filter element and said coupling element comprise respective capacitors of nearly identical electrical characteristics.

10. The filter of claim 9, wherein said capacitor filter element and said coupling element have respective capacitor values of $C_F$ and $C_D$, and wherein the turns ratio of said transformer is equal to $C_D \div (C_D + C_F)$.

11. The filter of claim 10, wherein said filter comprises a high frequency cutoff to a low frequency cutoff ratio of better than 1,000,000:1.

12. The filter of claim 11, wherein said output filter is operative for filtering frequency components of over 50 hertz.

13. The filter of claim 7, wherein said converter circuit is operable at internal switching frequencies of 80–200 kilohertz and wherein said DC voltages are in the range of 100–2,000 volts.

14. The filter of claim 7, wherein said voltage sensing means comprise a pair of resistors connected in series and wherein said input of said active filtering circuit is connected to said voltage sensing means at the interconnection terminal of said resistors.

* * * * *